US009631745B2

(12) United States Patent
Fujisawa et al.

(10) Patent No.: US 9,631,745 B2
(45) Date of Patent: Apr. 25, 2017

(54) PROCESSING APPARATUS FOR GUIDING WORKPIECE USING BELLOWS WITH FLOATING MEANS (71) Applicant: DISCO CORPORATION, Tokyo (JP)

(72) Inventors: Shinichi Fujisawa, Tokyo (JP); Toshifumi Matsuyama, Tokyo (JP); Jun Suwano, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 175 days.

(21) Appl. No.: 14/549,852

(22) Filed: Nov. 21, 2014

(65) Prior Publication Data
US 2015/0151396 A1 Jun. 4, 2015

(30) Foreign Application Priority Data

Dec. 3, 2013 (JP) .................................. 2013-250295

(51) Int. Cl.
*B23Q 5/34* (2006.01)
*F16L 11/11* (2006.01)
*B23Q 11/08* (2006.01)
*H01L 21/67* (2006.01)
*H01L 21/677* (2006.01)

(52) U.S. Cl.
CPC ........... *F16L 11/11* (2013.01); *B23Q 11/0816* (2013.01); *H01L 21/67092* (2013.01); *H01L 21/67709* (2013.01)

(58) Field of Classification Search
CPC  F16L 11/11; B23C 11/0816; H01L 21/67092; H01L 21/67709; H01L 21/68
USPC .............................................. 451/10; 269/56
See application file for complete search history.

(56) References Cited

U.S. PATENT DOCUMENTS

| 4,440,107 | A | * | 4/1984 | Doehler | C23C 16/545 118/50.1 |
| 4,624,617 | A | * | 11/1986 | Belna | B65G 54/02 104/282 |
| 4,690,066 | A | * | 9/1987 | Morishita | B60L 13/06 104/282 |
| 5,360,470 | A | * | 11/1994 | Ono | B60L 13/06 104/284 |

(Continued)

FOREIGN PATENT DOCUMENTS

| DE | 102011052406 A1 * | 2/2013 | ............. B23Q 3/155 |
| JP | 2002-066866 | 3/2002 | |

(Continued)

*Primary Examiner* — Joseph J Hail
*Assistant Examiner* — Arman Milanian
(74) *Attorney, Agent, or Firm* — Greer Burns & Crain, Ltd.

(57) ABSTRACT

A processing apparatus including an expansible and contractable bellows unit mounted on a workpiece holding unit for covering an area of movement of the workpiece holding unit in a feeding direction and a guide unit for guiding the expansion and contraction of the bellows unit in the feeding direction. The guide unit has an opening for allowing the movement of the workpiece holding unit in the feeding direction and a gutter extending in the feeding direction adjacent to the opening. The bellows unit has a bellows member having one end connected to the workpiece holding unit and the other end connected to the guide unit. The processing apparatus further includes a floating unit for floating the bellows member along the gutter of the guide unit in a noncontact manner.

2 Claims, 4 Drawing Sheets (56) References Cited

U.S. PATENT DOCUMENTS

| | | | | |
|---|---|---|---|---|
| 5,738,564 A * | 4/1998 | Helle | ............ | B23Q 1/01 |
| | | | | 451/10 |
| 5,815,246 A * | 9/1998 | Sperling | ............ | B23Q 1/621 |
| | | | | 269/73 |
| 6,110,010 A * | 8/2000 | Pflager | ............ | B23Q 1/38 |
| | | | | 310/12.04 |
| 6,164,881 A * | 12/2000 | Shono | ............ | B23Q 1/621 |
| | | | | 408/56 |
| 6,417,914 B1 * | 7/2002 | Li | ............ | G03B 27/58 |
| | | | | 310/12.06 |
| 6,603,531 B1 * | 8/2003 | Binnard | ............ | G03B 27/42 |
| | | | | 355/53 |
| 7,868,488 B2 * | 1/2011 | Lee | ............ | F16C 39/063 |
| | | | | 310/12.01 |
| 2006/0098184 A1 * | 5/2006 | Shibazaki | ............ | G03F 7/707 |
| | | | | 355/75 |
| 2006/0124864 A1 * | 6/2006 | Sogard | ............ | F16C 29/025 |
| | | | | 250/491.1 |
| 2008/0254715 A1 * | 10/2008 | Sekiya | ............ | B24B 7/228 |
| | | | | 451/10 |
| 2010/0043712 A1 * | 2/2010 | Tobe | ............ | C23C 14/12 |
| | | | | 118/728 |
| 2015/0158137 A1 * | 6/2015 | Mori | ............ | B24B 7/228 |
| | | | | 451/73 |

FOREIGN PATENT DOCUMENTS

| | | | | |
|---|---|---|---|---|
| JP | 2002066866 A * | 3/2002 | ............ | B23Q 11/08 |
| JP | 2007-201178 | 8/2007 | | |
| JP | 2011224729 A * | 11/2011 | ............ | B23Q 11/08 |
| JP | 5388229 B2 * | 1/2014 | ............ | B23Q 11/0816 |

\* cited by examiner

PROCESSING APPARATUS FOR GUIDING WORKPIECE USING BELLOWS WITH FLOATING MEANS

BACKGROUND OF THE INVENTION

Field of the Invention

The present invention relates to a processing apparatus such as a cutting apparatus for cutting a workpiece such as a semiconductor wafer and a laser processing apparatus for performing laser processing to such a workpiece.

Description of the Related Art

In a semiconductor device fabrication process, a plurality of crossing division lines are formed on the front side of a substantially disk-shaped semiconductor wafer to thereby define a plurality of separate regions where a plurality of semiconductor devices such as ICs and LSIs are respectively formed. The semiconductor wafer thus having the plural semiconductor devices is cut along the division lines to thereby divide the regions where the semiconductor devices are formed from each other, thus manufacturing the individual semiconductor devices as chips. Further, a gallium nitride compound semiconductor or the like is formed on the front side of a sapphire substrate to obtain an optical device wafer. The optical device wafer is also cut along the division lines to thereby divide the regions where a plurality of optical devices such as light emitting diodes and laser diodes are formed from each other, thus manufacturing the individual optical devices as chips.

Cutting of such a wafer along the division lines is usually performed by using a cutting apparatus or a laser processing apparatus. The cutting apparatus includes workpiece holding means for holding a workpiece, cutting means for cutting the workpiece held by the workpiece holding means as supplying a processing water to the workpiece, feeding means for moving the workpiece holding means in a feeding direction, bellows means provided on the opposite sides of the workpiece holding means in the feeding direction so as to cover the feeding means and adapted to be moved together with the workpiece holding means in the feeding direction, the bellows means being expansible and contractable in the feeding direction, and guide means for guiding the movement of the bellows means in the feeding direction (see Japanese Patent Laid-open No. 2002-66866, for example).

Further, the laser processing apparatus includes workpiece holding means for holding a workpiece, laser beam applying means for applying a laser beam to the workpiece held by the workpiece holding means, feeding means for moving the workpiece holding means in a feeding direction, bellows means provided on the opposite sides of the workpiece holding means in the feeding direction so as to cover the feeding means and adapted to be moved together with the workpiece holding means in the feeding direction, the bellows means being expansible and contractable in the feeding direction, and guide means for guiding the movement of the bellows means in the feeding direction (see Japanese Patent Laid-open No. 2007-201178, for example).

In each case, the bellows means is provided with a plurality of support members arranged at several positions in the feeding direction for preventing the slack of the bellows means in such a manner as to slide in contact with the guide means. Each support member is formed of a low-friction resin such as Teflon (registered trademark) and nylon or provided by a bearing or the like, so as to reduce the friction between each support member and the guide means.

SUMMARY OF THE INVENTION

However, when the workpiece holding means holding the workpiece is moved in the feeding direction at a high speed in order to improve the productivity, there arises a problem such that each support member provided on the bellows means cannot follow the high feed speed of the workpiece holding means, causing damage to each support member.

It is therefore an object of the present invention to provide a processing apparatus which can prevent the slack of the expansible and contractable bellows means mounted on the workpiece holding means so as to cover the feeding means and adapted to be moved together with the workpiece holding means in the feeding direction, wherein even when the workpiece holding means is moved in the feeding direction at a high speed, the support members for supporting the bellows means can follow the movement of the workpiece holding means, thereby preventing damage to the support members.

In accordance with an aspect of the present invention, there is provided a processing apparatus including workpiece holding means for holding a workpiece; processing means for processing the workpiece held by the workpiece holding means; feeding means for moving the workpiece holding means in a feeding direction; bellows means mounted on the workpiece holding means for covering an area of movement of the workpiece holding means in the feeding direction, the bellows means being expansible and contractable in the feeding direction; and guide means for guiding the expansion and contraction of the bellows means in the feeding direction; the guide means having an opening for allowing the movement of the workpiece holding means in the feeding direction, a gutter extending in the feeding direction adjacent to the opening, and an end wall provided at an end of the opening in the feeding direction; the bellows means having a first connecting member connected to the workpiece holding means, a second connecting member connected to the end wall of the guide means, and a bellows member extending between the first connecting member and the second connecting member; the processing apparatus further including floating means for floating the bellows member along the gutter of the guide means in a noncontact manner.

Preferably, the floating means includes a magnet rail extending along the gutter in the feeding direction and a floating magnet provided on the bellows member so as to be opposed to the magnet rail; the magnet rail being composed of a plurality of magnets juxtaposed in the feeding direction, the plurality of magnets being oriented so that their N poles or S poles are opposed to the bellows member; the floating magnet being opposed to the magnets of the magnet rail so that the poles having the same polarity face each other.

Alternatively, the floating means includes an air discharge rail extending along the gutter in the feeding direction and a slider provided on the bellows member so as to be opposed to the air discharge rail; the air discharge rail having a plurality of fine holes for discharging jets of air toward the slider.

As described above, the processing apparatus according to the present invention includes the expansible and contractable bellows means mounted on the workpiece holding means for covering the area of movement of the workpiece holding means in the feeding direction and the guide means for guiding the expansion and contraction of the bellows means in the feeding direction. The guide means includes the opening for allowing the movement of the workpiece holding means in the feeding direction, the gutter extending in the feeding direction adjacent to the opening, and the end wall provided at an end of the opening in the feeding direction. The bellows means includes the first connecting member connected to the workpiece holding means, the second connecting member connected to the end wall of the guide means, and the bellows member extending between the first connecting member and the second connecting member. The processing apparatus further includes the floating means for floating the bellows member along the gutter of the guide means in a noncontact manner. Accordingly, no friction is generated between the bellows means and the guide means, so that even when the feed speed of the workpiece holding means is high, the bellows means can follow the movement of the workpiece holding means, thereby improving the productivity.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
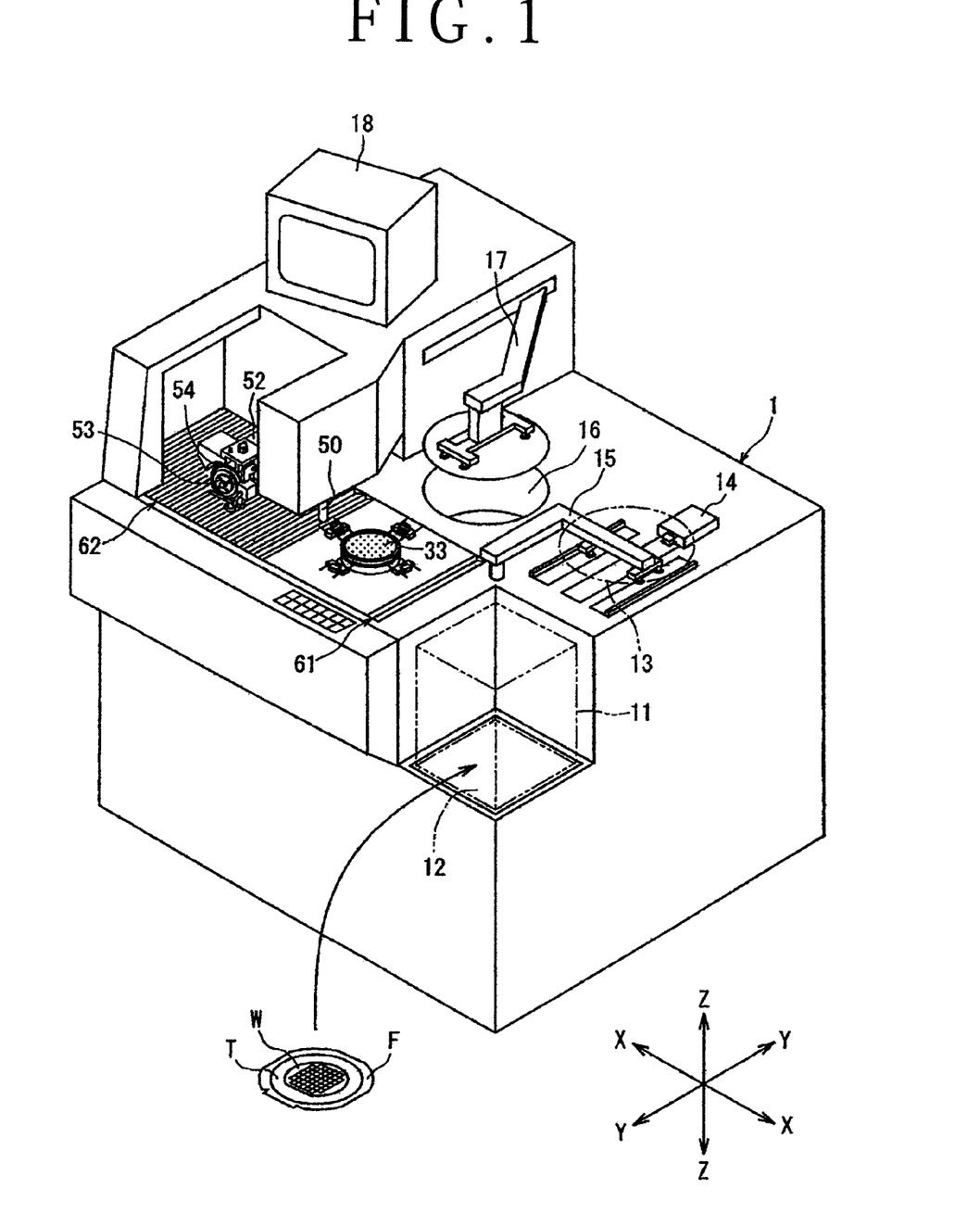
FIG. 1 is a perspective view of a cutting apparatus according to a preferred embodiment of the present invention.
Figure 2:
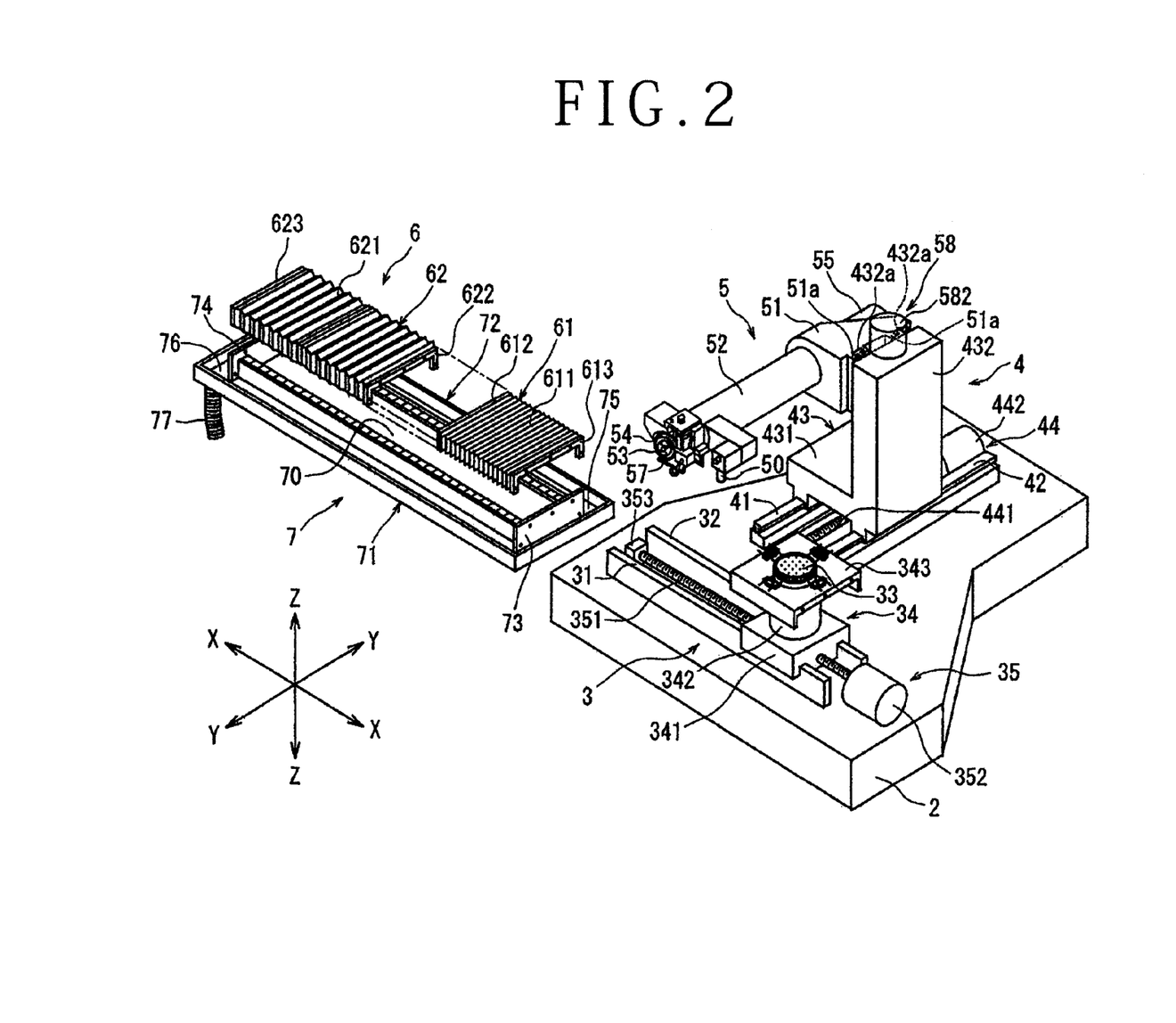
FIG. 2 is a perspective view of an essential part of the cutting apparatus shown in FIG. 1.

A preferred embodiment of the processing apparatus according to the present invention will now be described in detail with reference to the attached drawings. FIG. 1 is a perspective view of a cutting apparatus according to this preferred embodiment. The cutting apparatus shown in FIG. 1 includes a substantially boxlike base housing 1. As shown in FIG. 2, there are provided in the base housing 1 a stationary base 2, a chuck table mechanism 3 for holding a workpiece, the chuck table mechanism 3 being provided on the stationary base 2 so as to be movable in a feeding direction (X direction) shown by an arrow X, a spindle supporting mechanism 4 provided on the stationary base 2 so as to be movable in an indexing direction (Y direction) shown by an arrow Y perpendicular to the X direction, and a spindle unit 5 as cutting means provided on the spindle supporting mechanism 4 so as to be movable in a cutting direction (Z direction) shown by an arrow Z perpendicular to both the X direction and the Y direction.

The chuck table mechanism 3 includes two guide rails 31 and 32 provided on the stationary base 2 so as to extend parallel to each other in the X direction, a chuck table 33 as workpiece holding means supported to the guide rails 31 and 32 so as to be movable in the X direction, and a chuck table supporting mechanism 34 for supporting the chuck table 33. The chuck table supporting mechanism 34 includes a chuck table supporting base 341 provided on the guide rails 31 and 32 so as to be movable in the X direction, a cylindrical member 342 mounted on the chuck table supporting base 341, and a waterproof cover 343 mounted on the upper end of the cylindrical member 342 and positioned below the chuck table 33 by a predetermined level. The chuck table 33 is mounted on the upper end of a rotating shaft (not shown) provided in the cylindrical member 342. The chuck table 33 has an upper surface for holding a workpiece such as a disk-shaped semiconductor wafer under suction by operating suction means (not shown).

The chuck table mechanism 3 further includes feeding means 35 for moving the chuck table 33 in the X direction along the guide rails 31 and 32. The feeding means 35 includes an externally threaded rod 351 extending parallel to the guide rails 31 and 32 so as to be interposed therebetween and a servo motor 352 as a drive source for rotationally driving the externally threaded rod 351. The externally threaded rod 351 is rotatably supported at one end thereof to a bearing block 353 fixed to the stationary base 2 and is connected at the other end through a reduction gear (not shown) to the output shaft of the servo motor 352 so as to receive the torque thereof. The externally threaded rod 351 is engaged with a tapped through hole formed in an internally threaded block (not shown) projecting from the lower surface of a central portion of the chuck table supporting base 341 supporting the chuck table 33. Accordingly, the chuck table 33 is moved in the X direction along the guide rails 31 and 32 by operating the servo motor 352 to normally or reversely rotate the externally threaded rod 351.

Referring to FIGS. 1 and 2, the cutting apparatus according to this preferred embodiment further includes bellows means 6 for covering an area of movement of the chuck table 33 as workpiece holding means in the X direction and guide means 7 for guiding the expansion and contraction of the bellows means 6 in the X direction. The bellows means 6 includes first bellows means 61 and second bellows means 62 provided on the opposite sides of the chuck table 33 in the X direction, thereby covering the feeding means 35 and its associated parts.

The first bellows means 61 is composed of a bellows member 611, a first connecting member 612 mounted on one end of the bellows member 611, and a second connecting member 613 mounted on the other end of the bellows member 611. The bellows member 611 is formed from a foldable sheet member like a cloth such that a plurality of ridges and grooves are alternately formed so as to be expansible and contractable. Each of the first and second connecting members 612 and 613 may be formed from a metal plate. The first connecting member 612 mounted on one end of the bellows member 611 of the first bellows means 61 is connected to the waterproof cover 343 adapted to move with the chuck table 33. The second connecting member 613 mounted on the other end of the bellows member 611 is connected to an end wall of the guide means 7, which will be hereinafter described.

As similar to the first bellows means 61, the second bellows means 62 is composed of a bellows member 621, a first connecting member 622 mounted on one end of the bellows member 621, and a second connecting member 623 mounted on the other end of the bellows member 621. The bellows member 621 is formed from a foldable sheet member like a cloth such that a plurality of ridges and grooves are alternately formed so as to be expansible and contractable. Each of the first and second connecting members 622 and 623 may be formed from a metal plate. The first connecting member 622 mounted on one end of the bellows member 621 is connected to the waterproof cover 343 adapted to move with the chuck table 33. The second connecting member 623 mounted on the other end of the bellows member 621 is connected to the other end wall of the guide means 7, which will be hereinafter described.

The guide means 7 for guiding the expansion and contraction of the first bellows means 61 and the second bellows means 62 in the X direction includes an opening 70 for allowing the movement of the chuck table 33 in the X direction, a first gutter 71 extending in the X direction adjacent to one side of the opening 70, a second gutter 72 extending in the X direction adjacent to the other side of the opening 70, a first end wall 73 provided at one end of the opening 70 in the X direction, and a second end wall 74 provided at the other end of the opening 70 in the X direction. A first communication gutter 75 is provided outside the first end wall 73, and a second communication gutter 76 is provided outside the second end wall 74. The first and second gutters 71 and 72 are in communication with each other through the first and second communication gutters 75 and 76. A drain hose 77 is connected to the second communication gutter 76. The second connecting member 613 of the first bellows means 61 is connected to the first end wall 73 of the guide means 7 by means of fastening bolts (not shown). Similarly, the second connecting member 623 of the second bellows means 62 is connected to the second end wall 74 of the guide means 7 by means of fastening bolts (not shown).

Figure 3:
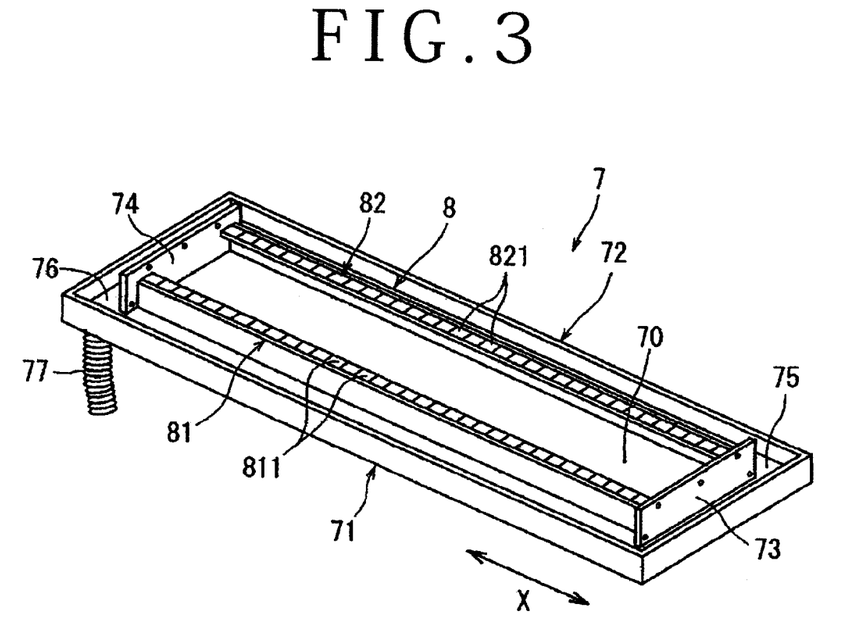
FIG. 3 is a perspective view showing a first preferred embodiment of floating means included in the cutting apparatus shown in FIG. 1.
Figure 4:
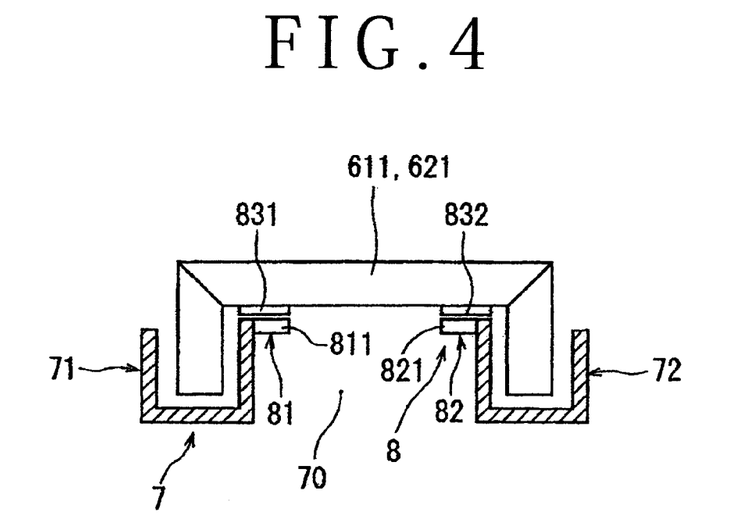
FIG. 4 is a sectional view of the floating means in the first preferred embodiment.

The cutting apparatus according to this preferred embodiment further includes floating means for floating the bellows member 611 of the first bellows means 61 and the bellows member 621 of the second bellows means 62 along the first gutter 71 and the second gutter 72 of the guide means 7 in a noncontact manner. A first preferred embodiment of this floating means will now be described with reference to FIGS. 3 and 4. In FIGS. 3 and 4, reference numeral 8 denotes floating means as the first preferred embodiment. The floating means 8 includes a first magnet rail 81 extending along the first gutter 71 in the X direction, a second magnet rail 82 extending along the second gutter 72 in the X direction, a first floating magnet 831 provided on the lower surface of each of the bellows member 611 of the first bellows means 61 and the bellows member 621 of the second bellows means 62 so as to be opposed to the first magnet rail 81, and a second floating magnet 832 provided on the lower surface of each of the bellows member 611 of the first bellows means 61 and the bellows member 621 of the second bellows means 62 so as to be opposed to the second magnet rail 82. The first magnet rail 81 is composed of a plurality of magnets 811 juxtaposed in the X direction, and these plural magnets 811 are oriented so that their N poles or S poles are opposed to the bellows member 611 of the first bellows means 61 and the bellows member 621 of the second bellows means 62. Similarly, the second magnet rail 82 is composed of a plurality of magnets 821 juxtaposed in the X direction, and these plural magnets 821 are oriented so that their N poles or S poles are opposed to the bellows member 611 of the first bellows means 61 and the bellows member 621 of the second bellows means 62.

In this preferred embodiment, the upper surface of each magnet 811 of the first magnet rail 81 (the surface opposed to the bellows member 611 of the first bellows means 61 and the bellows member 621 of the second bellows means 62) is set as an N pole. Similarly, the upper surface of each magnet 821 of the second magnet rail 82 (the surface opposed to the bellows member 611 of the first bellows means 61 and the bellows member 621 of the second bellows means 62) is set as an N pole. On the other hand, the lower surface of the first floating magnet 831 (the surface opposed to the plural magnets 811 of the first magnet rail 81) is set as the same pole (N pole) as that of the upper surface of each magnet 811. Similarly, the lower surface of the second floating magnet 832 (the surface opposed to the plural magnets 821 of the second magnet rail 82) is set as the same pole (N pole) as that of the upper surface of each magnet 821.

Thus, the plural magnets 811 of the first magnet rail 81 are opposed to the first floating magnet 831 so that the poles having the same polarity face each other. Similarly, the plural magnets 821 of the second magnet rail 82 are opposed to the second floating magnet 832 so that the poles having the same polarity face each other. Accordingly, the first floating magnet 831 floats over the plural magnets 811 of the first magnet rail 81, and the second floating magnet 832 floats over the plural magnets 821 of the second magnet rail 82. As a result, the bellows member 611 of the first bellows means 61 and the bellows member 621 of the second bellows means 62 are floated over the first and second magnet rails 81 and 82 in a noncontact manner.

The first floating magnet 831 may be provided by a single magnet or a plurality of magnets arranged in the X direction on the lower surface of each of the bellows members 611 and 621. Similarly, the second floating magnet 832 may be provided by a single magnet or a plurality of magnets arranged in the X direction on the lower surface of each of the bellows members 611 and 621. The first and second floating magnets 831 and 832 provided on the lower surface of each of the bellows members 611 and 621 function as support members for preventing the slack of the bellows members 611 and 621.

Figure 5:
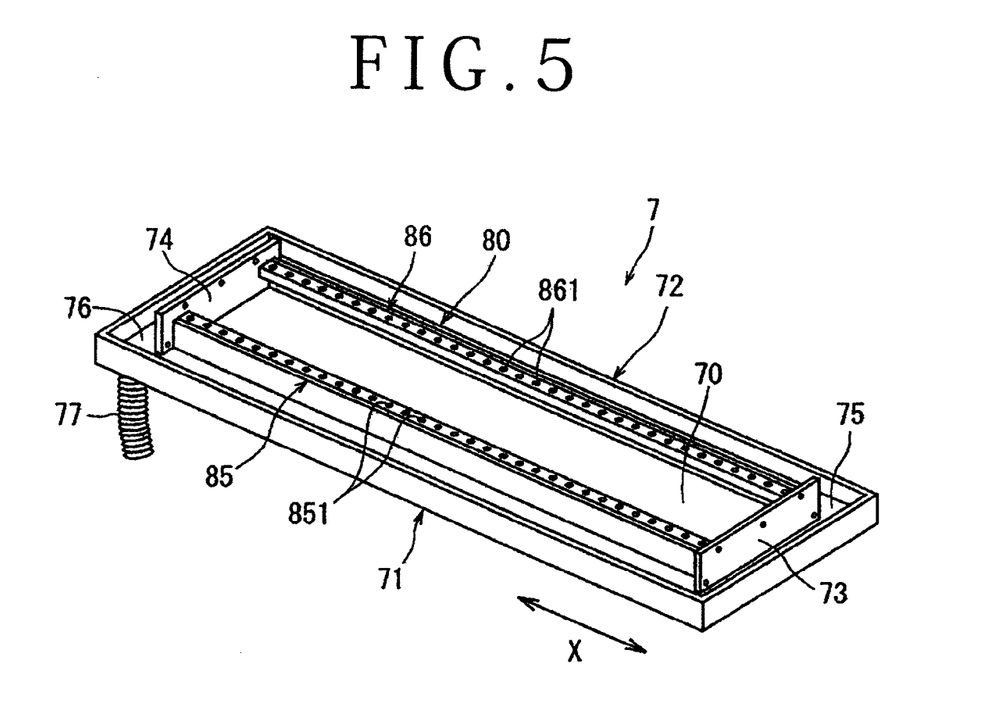
FIG. 5 is a perspective view showing a second preferred embodiment of the floating means included in the cutting apparatus shown in FIG. 1.
Figure 6:
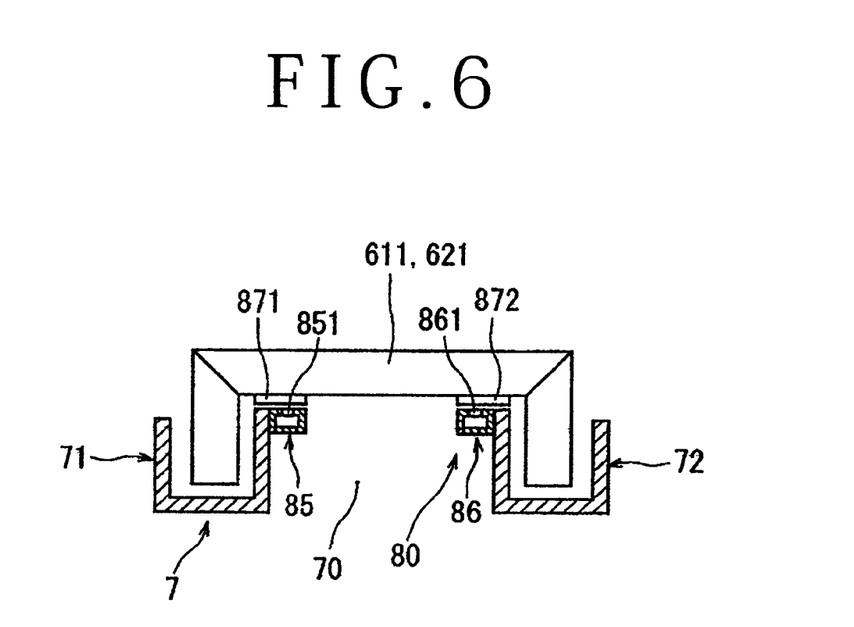
FIG. 6 is a sectional view of the floating means in the second preferred embodiment.

There will now be described with reference to FIGS. 5 and 6 a second preferred embodiment of the floating means for floating the bellows member 611 of the first bellows means 61 and the bellows member 621 of the second bellows means 62 along the first gutter 71 and the second gutter 72 of the guide means 7 in a noncontact manner. In FIGS. 5 and 6, reference numeral 80 denotes floating means as the second preferred embodiment. The floating means 80 includes a first air discharge rail 85 extending along the first gutter 71 in the X direction, a second air discharge rail 86 extending along the second gutter 72 in the X direction, a first slider 871 provided on the lower surface of each of the bellows member 611 of the first bellows means 61 and the bellows member 621 of the second bellows means 62 so as to be opposed to the first air discharge rail 85, and a second slider 872 provided on the lower surface of each of the bellows member 611 of the first bellows means 61 and the bellows member 621 of the second bellows means 62 so as to be opposed to the second air discharge rail 86.

The first air discharge rail 85 is a hollow member having a rectangular cross section, and the upper surface thereof (the surface opposed to the bellows member 611 of the first bellows means 61 and the bellows member 621 of the second bellows means 62) is formed with a plurality of fine holes 851 for discharging jets of air. Similarly, the second air discharge rail 86 is a hollow member having a rectangular cross section, and the upper surface thereof (the surface opposed to the bellows member 611 of the first bellows means 61 and the bellows member 621 of the second bellows means 62) is formed with a plurality of fine holes 861 for discharging jets of air. The first air discharge rail 85 and the second air discharge rail 86 are connected to air supplying means (not shown). On the other hand, the first slider 871 and the second slider 872 are formed of a low-friction resin in this preferred embodiment. In operation, the air supplying means (not shown) is operated to discharge jets of air from the plural fine holes 851 of the first air discharge rail 85 and the plural fine holes 861 of the second air discharge rail 86. Accordingly, the first slider 871 floats over the first air discharge rail 85, and the second slider 872 floats over the second air discharge rail 86. As a result, the bellows member 611 of the first bellows means 61 and the bellows member 621 of the second bellows means 62 are floated over the first and second air discharge rails 85 and 86 in a noncontact manner.

The first slider 871 may be provided by a single slider or a plurality of sliders arranged in the X direction on the lower surface of each of the bellows members 611 and 621. Similarly, the second slider 872 may be provided by a single slider or a plurality of sliders arranged in the X direction on the lower surface of each of the bellows members 611 and 621. The first and second sliders 871 and 872 provided on the lower surface of each of the bellows members 611 and 621 function as support members for preventing the slack of the bellows members 611 and 621.

Referring back to FIG. 2, the spindle supporting mechanism 4 includes two guide rails 41 and 42 provided on the stationary base 2 so as to extend parallel to each other in the Y direction and a movable support base 43 provided on the guide rails 41 and 42 so as to be movable in the Y direction. The movable support base 43 is composed of a horizontal portion 431 slidably supported to the guide rails 41 and 42 and a vertical portion 432 extending vertically upward from the upper surface of the horizontal portion 431. Further, two guide rails 432a are provided on one side surface of the vertical portion 432 so as to extend parallel to each other in the Z direction. The spindle supporting mechanism 4 further includes indexing means 44 for moving the movable support base 43 in the Y direction along the guide rails 41 and 42.

The indexing means 44 includes an externally threaded rod 441 extending parallel to the guide rails 41 and 42 so as to be interposed therebetween and a pulse motor 442 as a drive source for rotationally driving the externally threaded rod 441. The externally threaded rod 441 is rotatably supported at one end thereof to a bearing block (not shown) fixed to the stationary base 2 and is connected at the other end through a reduction gear (not shown) to the output shaft of the pulse motor 442 so as to receive the torque thereof. The externally threaded rod 441 is engaged with a tapped through hole formed in an internally threaded block (not shown) projecting from the lower surface of the horizontal portion 431 at a central portion thereof. Accordingly, the movable support base 43 is moved in the Y direction along the guide rails 41 and 42 by operating the pulse motor 442 to normally or reversely rotate the externally threaded rod 441.

The spindle unit 5 includes a unit holder 51, a spindle housing 52 mounted to the unit holder 51, and a rotating spindle 53 rotatably supported to the spindle housing 52. The unit holder 51 is formed with two guided grooves 51a for slidably engaging the two guide rails 432a provided on the vertical portion 432 of the movable support base 43. Accordingly, the unit holder 51 is supported to the movable support base 43 so as to be movable in the Z direction by the slidable engagement of the guided grooves 51a with the guide rails 432a. The rotating spindle 53 projects from the front end of the spindle housing 52, and a cutting blade 54 is mounted on the front end portion of the rotating spindle 53. The rotating spindle 53 thus having the cutting blade 54 is rotationally driven by a servo motor 55 as a drive source. A pair of cutting water nozzles 57 (one of which being shown in FIG. 2) for supplying a cutting water as a processing water to the workpiece in cutting are provided on both sides of the cutting blade 54.

The spindle unit 5 further includes moving means 58 for moving the unit holder 51 along the guide rails 432a in the Z direction. Like the feeding means 35 and the indexing means 44 mentioned above, this moving means 58 includes an externally threaded rod (not shown) extending parallel to the guide rails 432a so as to be interposed therebetween and a pulse motor 582 as a drive source for rotationally driving this externally threaded rod. Accordingly, the whole of the unit holder 51, the spindle housing 52, and the rotating spindle 53 is moved in the Z direction along the guide rails 432a by operating the pulse motor 582 to normally or reversely rotate this externally threaded rod.

The cutting apparatus according to this preferred embodiment further includes imaging means 50 provided at the front end portion of the spindle housing 52 of the spindle unit 5. The imaging means 50 includes a microscope, CCD camera, etc. for imaging a subject area such as division lines formed on the workpiece such as a semiconductor wafer. An image signal output from the imaging means 50 is transmitted to control means (not shown).

Referring back to FIG. 1, the cutting apparatus according to this preferred embodiment further includes a cassette 11 for storing a semiconductor wafer W as a workpiece. The semiconductor wafer W is stored in the cassette 11 in the condition where the wafer W is attached to a protective tape T supported to an annular frame F. The cassette 11 is placed on a cassette table 12 vertically movable by elevating means (not shown). The cutting apparatus shown in FIG. 1 further includes a temporary setting table 13 for temporarily setting the semiconductor wafer W thereon, handling means 14 for handling the semiconductor wafer W to take it from the cassette 11 to the temporary setting table 13 before cutting and also to take it from the temporary setting table 13 to the cassette 11 after cutting, first transfer means 15 for transferring the semiconductor wafer W from the temporary setting table 13 to the chuck table 33, cleaning means 16 for cleaning the semiconductor wafer W after cutting, and second transfer means 17 for transferring the semiconductor wafer W from the chuck table 33 to the cleaning means 16 after cutting. The first transfer means 15 also functions to transfer the semiconductor wafer W from the cleaning means 16 to the temporary setting table 13 after cleaning. The cutting apparatus shown in FIG. 1 further includes display means 18 for displaying an image or the like obtained by the imaging means 50.

The operation of the cutting apparatus described above will now be described. The cassette table 12 is vertically moved by the elevating means (not shown) to thereby vertically move the cassette 11 and set the semiconductor wafer W stored at a predetermined position in the cassette 11 to a given exit position (the semiconductor wafer W supported through the protective tape T to the annular frame F will be hereinafter referred to simply as the semiconductor wafer W). Thereafter, the handling means 14 is operated to take the semiconductor wafer W set at the exit position from the cassette 11 to the temporary setting table 13. Thereafter, the first transfer means 15 is pivotally operated to transfer the semiconductor wafer W from the temporary setting table 13 to the chuck table 33 set at a standby position shown in FIG. 1. In this condition, the suction means (not shown) is operated to hold the semiconductor wafer W on the chuck table 33 under suction. The chuck table 33 thus holding the semiconductor wafer W is next moved in the X direction from the standby position to an alignment position directly below the imaging means 50. At this alignment position, the imaging means 50 is operated to detect a plurality of division lines formed on the semiconductor wafer W. The chuck table 33 is next moved in the X direction from the alignment position to a working position directly below the cutting blade 54. Further, the spindle unit 5 is moved in the Y direction as the indexing direction to thereby precisely align the cutting blade 54 with a predetermined one of the division lines.

Thereafter, the chuck table 33 holding the semiconductor wafer W is moved in the X direction as the feeding direction (the direction perpendicular to the axis of rotation of the cutting blade 54), thereby cutting the semiconductor wafer W along the predetermined division line by the cutting blade 54. More specifically, the cutting blade 54 is moved in the Z direction as the cutting direction by a predetermined amount in the condition where it is aligned with the predetermined division line in the Y direction. Further, the cutting blade 54 is rotated at a high speed (e.g., 30,000 rpm) by the servo motor 55. In this condition, the chuck table 33 holding the semiconductor wafer W is moved in the X direction at a predetermined feed speed (e.g., 50 mm/sec). As a result, the semiconductor wafer W held on the chuck table 33 is cut along the predetermined division line by the cutting blade 54 (cutting step). At this time, a cutting water as a processing water is supplied from the cutting water nozzles 57 to a subject area of the semiconductor wafer W to be cut. The cutting water supplied to the subject area is allowed to flow from the waterproof cover 343 and the first and second bellows means 61 and 62 constituting the bellows means 6 down to the first and second gutters 71 and 72 constituting the guide means 7. Thereafter, the cutting water is drained through the drain hose 77 connected to the second communication gutter 76.

In the cutting step mentioned above, the waterproof cover 343 is moved together with the chuck table 33, so that the first bellows means 61 and the second bellows means 62 provided on the opposite sides of the waterproof cover 343 are expanded and contracted in the X direction. In this expansion and contraction of the first and second bellows means 61 and 62, the floating means 8 shown in FIGS. 3 and 4 is operated in the following manner. The first and second floating magnets 831 and 832 functioning as the support members for preventing the slack of the bellows member 611 of the first bellows means 61 and the bellows member 621 of the second bellows means 62 are allowed to move along the first and second magnet rails 81 and 82, respectively. As described above, the plural magnets 811 of the first magnet rail 81 and the plural magnets 821 of the second magnet rail 82 are opposed to the first floating magnet 831 and the second floating magnet 832, respectively, in the condition where the same poles face each other. Accordingly, the first floating magnet 831 floats over the plural magnets 811 of the first magnet rail 81 in a noncontact manner, and the second floating magnet 832 also floats over the plural magnets 821 of the second magnet rail 82 in a noncontact manner. Accordingly, no friction is generated between the first floating magnet 831 and the first magnet rail 81 and between the second floating magnet 832 and the second magnet rail 82. As a result, even when the feed speed of the chuck table 33 is high, the first and second floating magnets 831 and 832 as the support members for the bellows members 611 and 621 can follow the movement of the chuck table 33, thereby improving the productivity.

Further, in the expansion and contraction of the first and second bellows means 61 and 62 in the cutting step mentioned above, the floating means 80 shown in FIGS. 5 and 6 is operated in the following manner. The first and second sliders 871 and 872 functioning as the support members for preventing the slack of the bellows member 611 of the first bellows means 61 and the bellows member 621 of the second bellows means 62 are allowed to move along the first and second air discharge rails 85 and 86, respectively. At this time, air is discharged from the plural fine holes 851 of the first air discharge rail 85 and the plural fine holes 861 of the second air discharge rail 86. Accordingly, the first slider 871 floats over the first air discharge rail 85 in a noncontact manner, and the second slider 872 floats over the second air discharge rail 86 in a noncontact manner. Accordingly, no friction is generated between the first slider 871 and the first air discharge rail 85 and between the second slider 872 and the second air discharge rail 86. As a result, even when the feed speed of the chuck table 33 is high, the first and second sliders 871 and 872 as the support members for the bellows members 611 and 621 can follow the movement of the chuck table 33, thereby improving the productivity.

Having thus described specific preferred embodiments of the present invention, it should be noted that the present invention is not limited to the above preferred embodiments, but various modifications may be made within the scope of the present invention. For example, while the present invention is applied to a cutting apparatus in the above preferred embodiment, the present invention may be applied also to a laser processing apparatus such that the workpiece holding means for holding a workpiece is moved in the feeding direction or a grinding apparatus such that the bellows means is mounted on the workpiece holding means for holding a workpiece.

The present invention is not limited to the details of the above described preferred embodiments. The scope of the invention is defined by the appended claims and all changes and modifications as fall within the equivalence of the scope of the claims are therefore to be embraced by the invention.

What is claimed is:
1. A processing apparatus comprising:
workpiece holding means for holding a workpiece;
processing means for processing said workpiece held by said workpiece holding means;
feeding means for moving said workpiece holding means in a feeding direction;
bellows means mounted on said workpiece holding means for covering an area of movement of said workpiece holding means in said feeding direction, said bellows means being expansible and contractable in said feeding direction; and
guide means for guiding the expansion and contraction of said bellows means in said feeding direction;
said guide means having an opening for allowing the movement of said workpiece holding means in said feeding direction, a gutter extending in said feeding direction adjacent to said opening, and an end wall provided at an end of said opening in said feeding direction;
said bellows means having a first connecting member connected to said workpiece holding means, a second connecting member connected to said end wall of said guide means, and a bellows member extending between said first connecting member and said second connecting member;
said processing apparatus further including floating means for floating said bellows member along said gutter of said guide means in a noncontact manner,
wherein said floating means includes a magnet rail extending along said gutter in said feeding direction and a floating magnet provided on said bellows member so as to be opposed to said magnet rail;

said magnet rail being composed of a plurality of magnets juxtaposed in said feeding direction, said plurality of magnets being oriented so that their N poles or S poles are opposed to said bellows member;

said floating magnet being opposed to said magnets of said magnet rail so that the poles having the same polarity face each other.

2. A processing apparatus comprising:

workpiece holding means for holding a workpiece;

processing means for processing said workpiece held by said workpiece holding means;

feeding means for moving said workpiece holding means in a feeding direction;

bellows means mounted on said workpiece holding means for covering an area of movement of said workpiece holding means in said feeding direction, said bellows means being expansible and contractable in said feeding direction; and guide means for guiding the expansion and contraction of said bellows means in said feeding direction;

said guide means having an opening for allowing the movement of said workpiece holding means in said feeding direction, a gutter extending in said feeding direction adjacent to said opening, and an end wall provided at an end of said opening in said feeding direction;

said bellows means having a first connecting member connected to said workpiece holding means, a second connecting member connected to said end wall of said guide means, and a bellows member extending between said first connecting member and said second connecting member;

said processing apparatus further including floating means for floating said bellows member along said gutter of said guide means in a noncontact manner, wherein said floating means includes an air discharge rail extending along said gutter in said feeding direction and a slider provided on said bellows member so as to be opposed to said air discharge rail;

said air discharge rail having a plurality of fine holes for discharging jets of air toward said slider.

* * * * *